(12) United States Patent
Thomas, III et al.

(10) Patent No.: US 7,067,898 B1
(45) Date of Patent: Jun. 27, 2006

(54) SEMICONDUCTOR DEVICE HAVING A SELF-ALIGNED BASE CONTACT AND NARROW EMITTER

(75) Inventors: Stephen Thomas, III, Redondo Beach, CA (US); Yakov Royter, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 85 days.

(21) Appl. No.: 10/854,680

(22) Filed: May 25, 2004

(51) Int. Cl.
*H01L 29/00* (2006.01)

(52) U.S. Cl. .................. 257/552; 257/554; 257/556; 257/557; 257/561; 257/563; 257/564; 257/565; 257/E29.033

(58) Field of Classification Search ............ None
See application file for complete search history.

(56) References Cited

U.S. PATENT DOCUMENTS

| | | | |
|---|---|---|---|
| 5,098,853 A | 3/1992 | Clark et al. | 437/31 |
| 5,159,423 A | 10/1992 | Clark et al. | 357/34 |
| 5,272,095 A | 12/1993 | Enquist et al. | 437/31 |
| 5,318,916 A | 6/1994 | Enquist et al. | 437/31 |
| 5,486,483 A | 1/1996 | Lammert | 437/39 |
| 5,610,085 A | 3/1997 | Yuan et al. | 437/29 |
| 5,641,975 A | 6/1997 | Agrarwal et al. | 257/76 |
| 5,648,666 A | 7/1997 | Tran et al. | 257/197 |
| 5,665,614 A | 9/1997 | Hafizi et al. | 438/320 |
| 5,672,522 A | 9/1997 | Streit et al. | 437/31 |
| 5,804,487 A | 9/1998 | Lammert | 438/319 |
| 5,903,018 A | 5/1999 | Shimawaki | 257/198 |
| 6,573,539 B1 | 6/2003 | Huang | 27/197 |
| 6,855,948 B1 | 2/2005 | Chow et al. | 257/18 |
| 6,873,029 B1 * | 3/2005 | He et al. | 257/586 |
| 2001/0013635 A1 * | 8/2001 | Kitahata | 257/565 |

OTHER PUBLICATIONS

Arai, T., et al., "Reduction of Base-Collector Capacitance in Submicron InP/GaInAs Heterojunction Bipolar Transistors with Buried Tungsten Wires," *Jpn. J. Appl. Phys.*, vol. 40, Part 2, No. 7B, pp. L735-737 (Jul. 15, 2001).

Miyamoto, Y., et al., "Reduction of Base-Collector Capacitance in GaInAs/InP Heterojunction Bipolar Transistor By Using InP Buried Growth of Tungsten," *Department of Physical Electronics*, Tokyo Institute of Technology, 4 pages total (2001).

Sun, M., et al., "A Non-Self Aligned InP HBT Production Process," *GasMANTECH Conference*, 4 pages total (2002).

(Continued)

*Primary Examiner*—Andy Huynh
(74) *Attorney, Agent, or Firm*—Ladas & Parry LLP (57) ABSTRACT

A semiconductor structure having a self-aligned base contact and an emitter, where the base contact is electrically isolated from the emitter by a dielectric layer. The separation between the base contact and the emitter is determined by the thickness of the dielectric layer and the width of the emitter is determined by the minimum resolution provided by the fabrication techniques and tools used to define features within the dielectric layer.

20 Claims, 6 Drawing Sheets

OTHER PUBLICATIONS

U.S. Appl. No. 11/109,288, filed Apr. 18, 2005, Thomas III et al.

Averett, K.L., et al. "Low-Voltage InAsP/InAs HBT and Metamorphic InAs BJT Devices Grown By Molecular Beam Epitaxy," *Journal of Crystal Growth*, vol. 251, pp. 852-857 (2003).

Rieh, J.S., et al., "SiGe HBTs With Cut-Off Frequency of 350GHz," *IEEE International Electron Devices Meeting Digest*, pp. 771-774 (2002).

* cited by examiner

SEMICONDUCTOR DEVICE HAVING A SELF-ALIGNED BASE CONTACT AND NARROW EMITTER

BACKGROUND

1. Field

The present disclosure describes a semiconductor device having a self-aligned base contact and a narrow emitter.

2. Description of Related Art

In heterojunction bipolar transistor (HBT) technology, two parameters that are ideally optimized are the transit frequency ($f_t$) and the maximum frequency ($f_{max}$) of the HBT. The transit frequency is a measure of the frequency at which the small signal current gain of the HBT is approximately unity. The maximum frequency of the transistor is the frequency at which the input power equals the output power.

Figure 1:
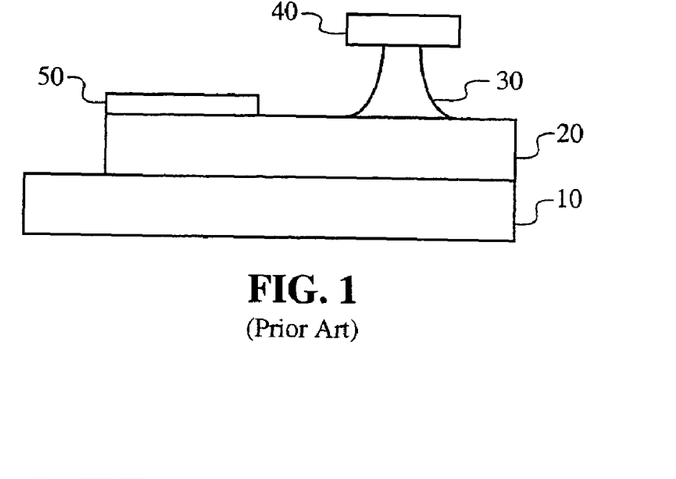
FIG. 1 (prior art) illustrates a prior art HBT with self-aligned base contacts.

One technique for optimizing the maximum frequency is to reduce the emitter width and reduce the spacing between the emitter and the base contact. Previously, to reduce the spacing between the emitter and the base contact, a self-aligned base contact was used in the HBT. When depositing a self-aligned base contact, a portion of the emitter under the emitter contact is removed so as to undercut the emitter contact. Undercutting the emitter contact forms an overhang that is used as a mask to deposit the base contact. Shown in FIG. 1 is an HBT with a self-aligned base contact. The HBT comprises a collector 10, base 20, emitter 30, and emitter contact 40. The emitter contact 40 is undercut so as to remove a portion of the emitter 30. Then using the emitter contact 40 as a mask, the base contact 50 is deposited. By monitoring the undercut, the base contact 50 can be closely deposited to the emitter 30. Also, removing a portion of the emitter 30 helps to reduce the width of the emitter 30. However, undercutting the emitter contact 40 makes use of a crystallographic wet chemical etchant, which has some drawbacks.

One drawback is that the emitter height to width ratio must be carefully monitored during the undercutting process. While submerged in the wet-etchant, if the emitter width becomes too narrow, the emitter contact may "lift off" from the emitter and float away. As a result, there is a lower limit on the width of the emitter that may remain submerged in the wet-etchant, which places a practical limit on the maximum frequency on the device. In current state of the art technology this lower limit is around 0.5 µm. Another drawback is that the spacing between the base contact and emitter sidewall can be difficult to control. If the base contact is placed too close to the emitter, undesirable leakage currents may form resulting in low beta values, or the base contact may short with the emitter. Yet another drawback is that the undercutting process results in an undercut which can be more severe at the emitter/emitter contact interface than at the emitter/base interface. This results in the emitter resistance being increased.

As a result, there is a need for a semiconductor device in which the width of the emitter and the spacing between the emitter and base contact is not determined by the aforedescribed undercutting process.

SUMMARY

An embodiment of the present invention provides a self-aligned base contact and an emitter. Using fabrication techniques and equipment known-in-the-art, an emitter width as small as 0.15 µm may be realized. In embodiments of the present invention, the separation between the base contact and the emitter is determined by the thickness of a first dielectric layer and the width of the emitter is determined by the minimum resolution of the photolithography tools used to define features within the dielectric layer.

One embodiment of the present invention provides a semiconductor structure comprising: a first semiconductor layer and a first semiconductor contact disposed on the first semiconductor layer; a dielectric cap on the first semiconductor contact, where the first semiconductor contact and dielectric cap defining an inner portion; a second semiconductor layer disposed on the first semiconductor layer in the inner portion; and a dielectric sidewall disposed in the inner portion between the second semiconductor layer and the first semiconductor contact, where the dielectric sidewall electrically isolates the second semiconductor layer from the first semiconductor contact.

Another embodiment of the present invention provides a heterojunction bipolar transistor comprising: a substrate layer; a subcollector layer on the substrate layer; a collector layer on the subcollector layer; a base layer on the collector; one or more base contacts disposed on the base layer; one or more dielectric caps disposed on the one or more base contacts; an emitter layer disposed on the base layer adjacent the one or more base contacts; at least one emitter contact disposed on said emitter layer; and one or more dielectric sidewalls disposed between the emitter layer and the one or more base contacts, wherein the one or more dielectric sidewalls electrically isolate the emitter layer from the one or more base contacts.

Still another embodiment of the present invention provides a method of fabricating a semiconductor structure comprising: disposing a first semiconductor layer; disposing one or more first semiconductor contacts on the first semiconductor layer; disposing one or more dielectric caps on the one or more first semiconductor contacts; forming one or more recessed areas in the first semiconductor layer to provide one or more raised areas of the first semiconductor layer; depositing a dielectric layer on the first semiconductor layer and on the one or more dielectric caps; etching a portion of the dielectric layer to expose a portion of the first semiconductor layer adjacent the one or more first semiconductor contacts and leaving a portion of the dielectric layer covering the one or more first semiconductor contacts in a region between the one or more first semiconductor contacts and the exposed portion of the first semiconductor layer; and depositing a second semiconductor layer on the exposed portion of the first semiconductor layer and adjacent the one or more first semiconductor contacts and the one or more dielectric caps, where the dielectric layer electrically isolates the one or more first semiconductor contacts from the second semiconductor layer.

BRIEF DESCRIPTION OF DRAWINGS

FIG. 3B-1 illustrates a top view of the semiconductor depicted in FIG. 3B

FIG. 3D-1 illustrates a top view of the structure in FIG. 3D.

DETAILED DESCRIPTION

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of certain elements shown in the accompanying drawings may be exaggerated to more clearly show details. The present invention should not be construed as being limited to the dimensional relations shown in the drawings, nor should the individual elements shown in the drawings be construed to be limited to the dimensions shown.

An embodiment of the present invention provides a semiconductor structure useful for allowing self-aligned base contacts to be deposited. An embodiment of the present invention also provides a structure in which an emitter may be deposited having a width as small as 0.15 μm at the emitter/base interface without using an "undercutting process."

Figure 2A:
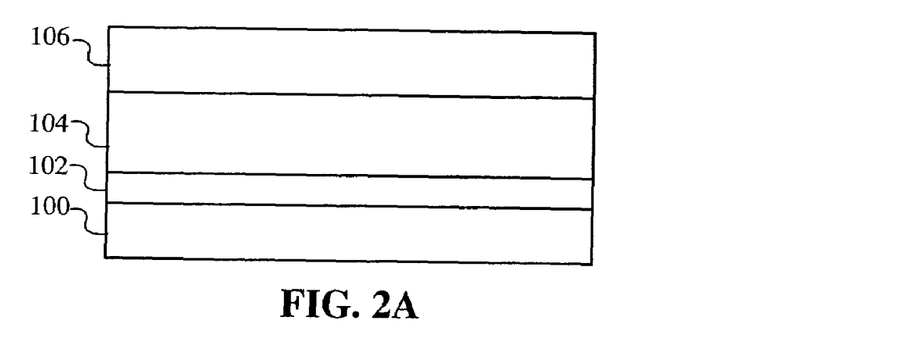
FIG. 2A illustrates a partially completed semiconductor structure that may be used in embodiments of the present invention.

FIG. 2A shows a partially completed HBT structure that may be used in accordance with an embodiment of the present invention. Although the transistor structure shown is of the heterojunction variety, those skilled in the art will realize that embodiments of the present invention are applicable to transistors of the homojunction variety as well. The structure comprises a substrate layer 100, and a subcollector layer 102 and a collector layer 104, which are both preferably epitaxially grown on the substrate layer 100.

Figure 2B:
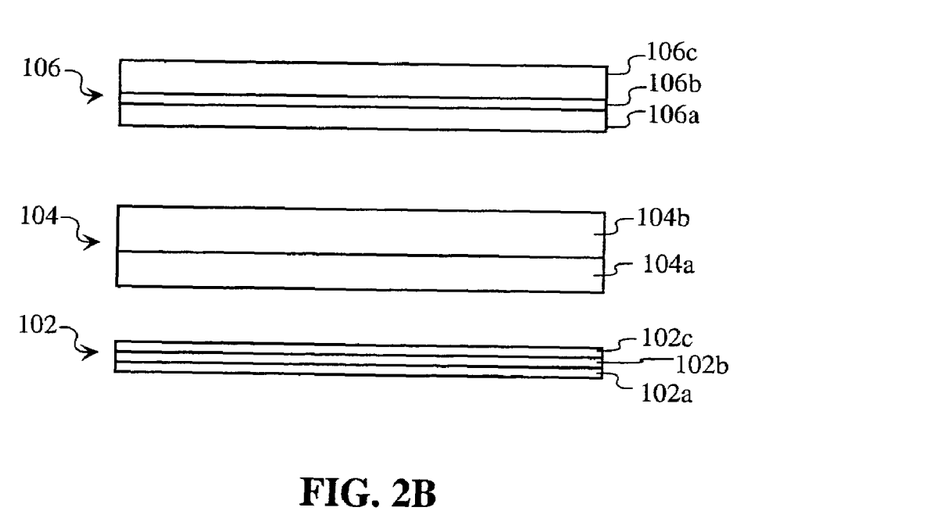
FIG. 2B shows an exploded view of some of the layers of the semiconductor structure depicted in FIG. 2A.

The substrate layer 100 preferably comprises InP. The subcollector layer 102 preferably comprises layers of InGaAs or InP or some combination thereof. For example, FIG. 2B illustrates the subcollector layer 102 comprising a n$^+$ doped GaInAs layer 102a, a n$^+$ doped InP layer 102b, and a n$^+$ doped GaInAs layer 102c. The collector layer 104 preferably comprises layers of InGaAs or InP or some combination thereof. For example, FIG. 2B illustrates the collector layer 104 comprising an n-doped InP layer 104a, followed by an n-doped quaternary grade 104b.

A base layer 106 is disposed on the collector layer 104, again preferably by epitaxial growth. The base layer 106 may comprise layers of GaInAs, InP, or some combination thereof. For example, FIG. 2B shows the base layer 106 comprising a first sublayer 106a of 10–20 nm thick p$^+$ GaInAs lattice-matched to InP, a second sublayer 106b of 1 nm thick p$^+$ InP, and a third sublayer 106c of 20–80 nm thick p$^+$ GaInAs. Finally, a quaternary grade may be provided above the third sublayer 106c. Although the HBT structure is described with reference to InP based materials, those skilled in the art will realize that this invention can be used with any III–V based semiconductor materials.

Figure 3A:
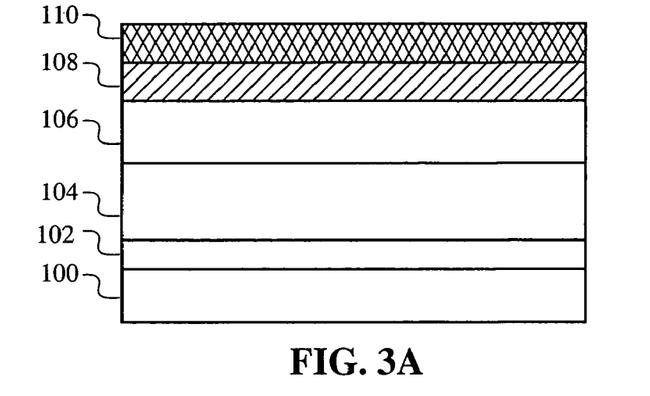
FIG. 3A illustrates a metal layer and a first insulating layer deposited on the semiconductor structure depicted in FIG. 2A.

Next, a metal layer 108 is deposited on the base layer 106 as shown in FIG. 3A. Preferably, the metal layer 108 comprises a refractory metal, such as tungsten or molybdenum, to withstand the high temperatures that may be present in subsequent steps. The metal layer 108 preferably has a thickness of 20–100 nm, and may be deposited by sputtering or evaporation. As is also shown in FIG. 3A, the metal layer 108 is capped with a first dielectric layer 110, preferably comprising SiN.

Figure 3B:
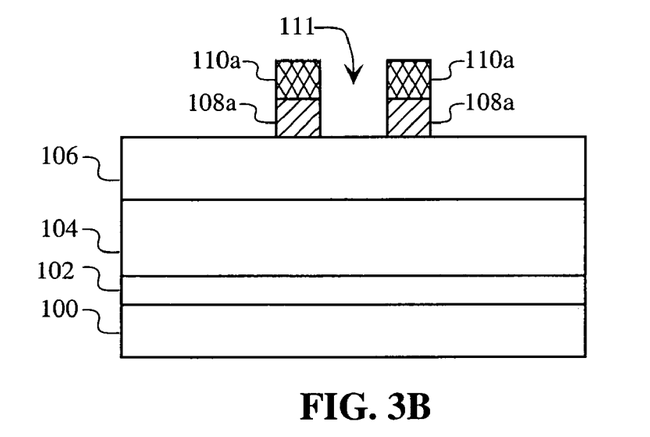
FIG. 3B illustrates the formation of base contacts and dielectric caps in the metal layer and first insulating layer shown in FIG. 3A.
Figure 3B:
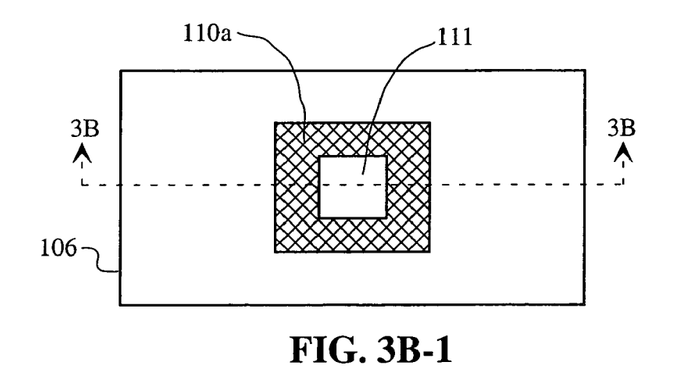

A base contact 108a is formed in the metal layer 108 on the base 106 as shown in FIG. 3B. Semiconductor fabrication techniques such as photolithography and a CF$_4$ dry etch (or similar dry etch chemistry) may be used to define the base contact 108a. A portion of the first dielectric layer 110 also remains on the base contact 108a to function as a dielectric cap 110a, discussed later. FIG. 3B-1 shows a top view of the semiconductor structure after defining the base contact 108a and dielectric cap 110a. The base contact 108a is hidden by the dielectric cap 110a. As can be seen in FIG. 3B-1, the base contact 108a and dielectric cap 110a form a closed hollow rectangle to define an inner portion 111. The inner portion III of the base contact 108a is the region in which an emitter will be subsequently deposited. Also, those skilled in the art will realize that the base contact may comprise various other shapes and may not form a closed loop.

The final width of the subsequently deposited emitter may be limited by the minimum resolution of the photolithography tools used to define the base contact 108a and dielectric cap 110a. Current-state-of-the-art I-line steppers can provide a resolution of about 0.3 μm which is sufficient to fabricate an emitter with a width of 0.1 μm at the portion of the emitter nearest the base 106. This narrow separation of the emitter at the emitter/base interface will ultimately help improve $f_{max}$ of the HBT.

Figure 3C:
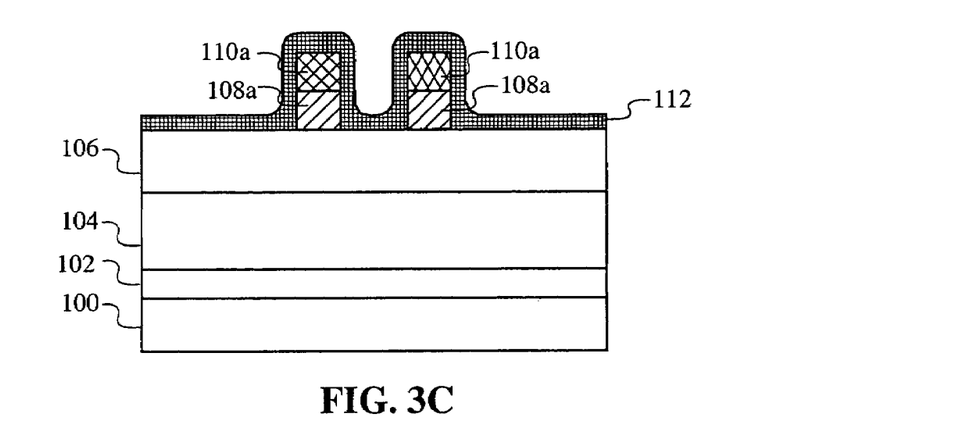
FIG. 3C illustrates the second insulating layer formed over the base contacts and dielectric caps illustrated in FIG. 3B.
Figure 3D:
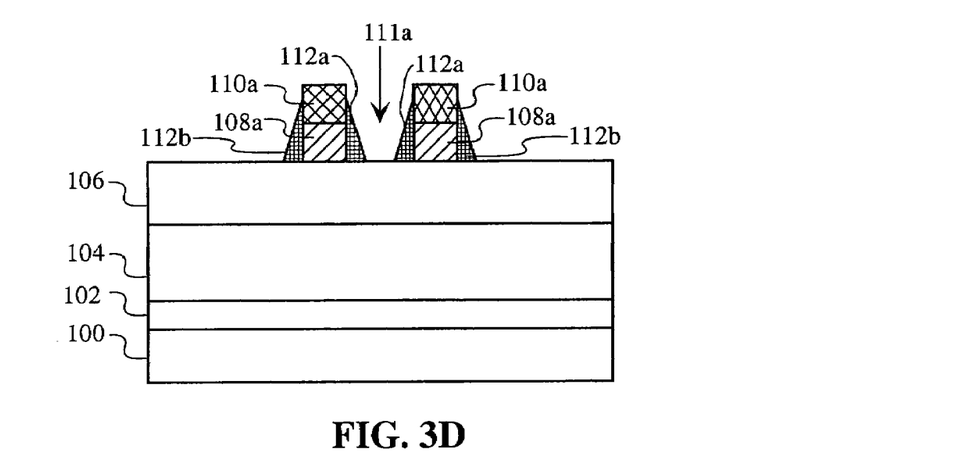
FIG. 3D illustrates the formation of dielectric sidewalls in the second insulating layer.
Figure 3D:
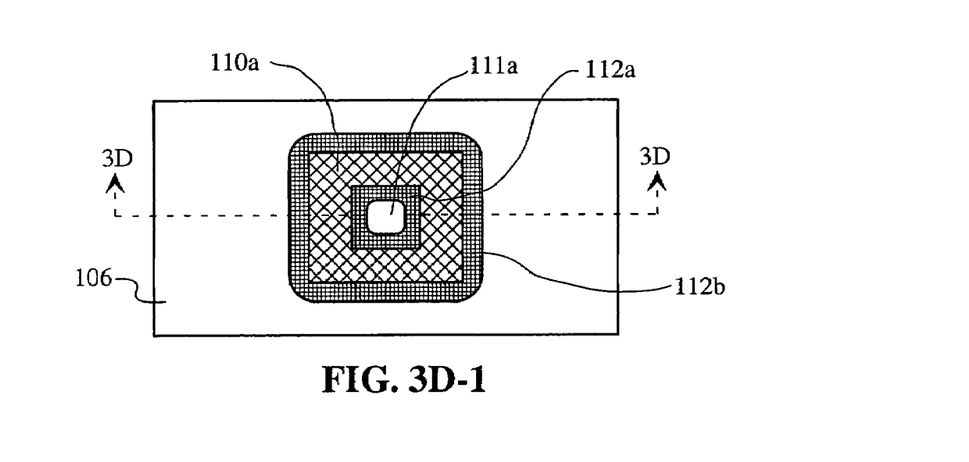

A second dielectric layer 112, preferably comprising SiN, is subsequently deposited over the exposed portion of the base layer 106 and the dielectric cap 110a as shown in FIG. 3C. The second dielectric layer 112 is etched away, preferably by an anisotropic dry etch, leaving an inner dielectric sidewall 112a and an outer dielectric sidewall 112b adjacent and in contact with the base contact 108a as shown in FIG. 3D. Due to the conformal deposition of the second dielectric layer 112, there may still be a slight undercut, which typically results in the inner and outer dielectric sidewalls 112a, 112b being somewhat slanted. The formation of the inner dielectric sidewall 112a provides a modified inner portion 111a, which is a region over the base layer 106 on which an emitter will be formed. Formation of the inner and outer dielectric sidewalls 112a, 112b may result in the sidewalls 112a, 112b being 0.075–0.1 μm wide at their widest spots (i.e. the portion of the inner and outer dielectric sidewalls 112a, 112b contacting the base layer 106). FIG. 3D-1 shows a top view of the inner and outer dielectric sidewalls 112a, 112b.

With photolithographic tools having a resolution of 0.3 µm, and an inner dielectric sidewall 112a with a width of 0.075–0.1 µm, an emitter having a width of 0.1–0.15 µm may be fabricated. The narrow width of the emitter at the base 106 will help improve $f_{max}$ of the HBT. Furthermore, dry etching is preferred to wet etching, since dry etching is more accurate, which allows the inner and outer dielectric sidewalls 112a, 112b to remain substantially symmetrical about the base contact 108a. As a result, the subsequently deposited emitter is more likely to be symmetrical with respect to the base contact 108a, thereby helping to prevent short circuits and leakage currents. Note that some removal of the dielectric cap 110a may occur during the etch of the second dielectric layer 102, so the initial thickness of the cap 110a may be chosen to account for this removal. Alternatively, the material of the dielectric cap 110a and the second dielectric layer 112 may be selected to provide etch selectivity of the sidewalls 112a, 112b over the dielectric cap 110a.

Figures 4A, 4B, 4C, 4D:
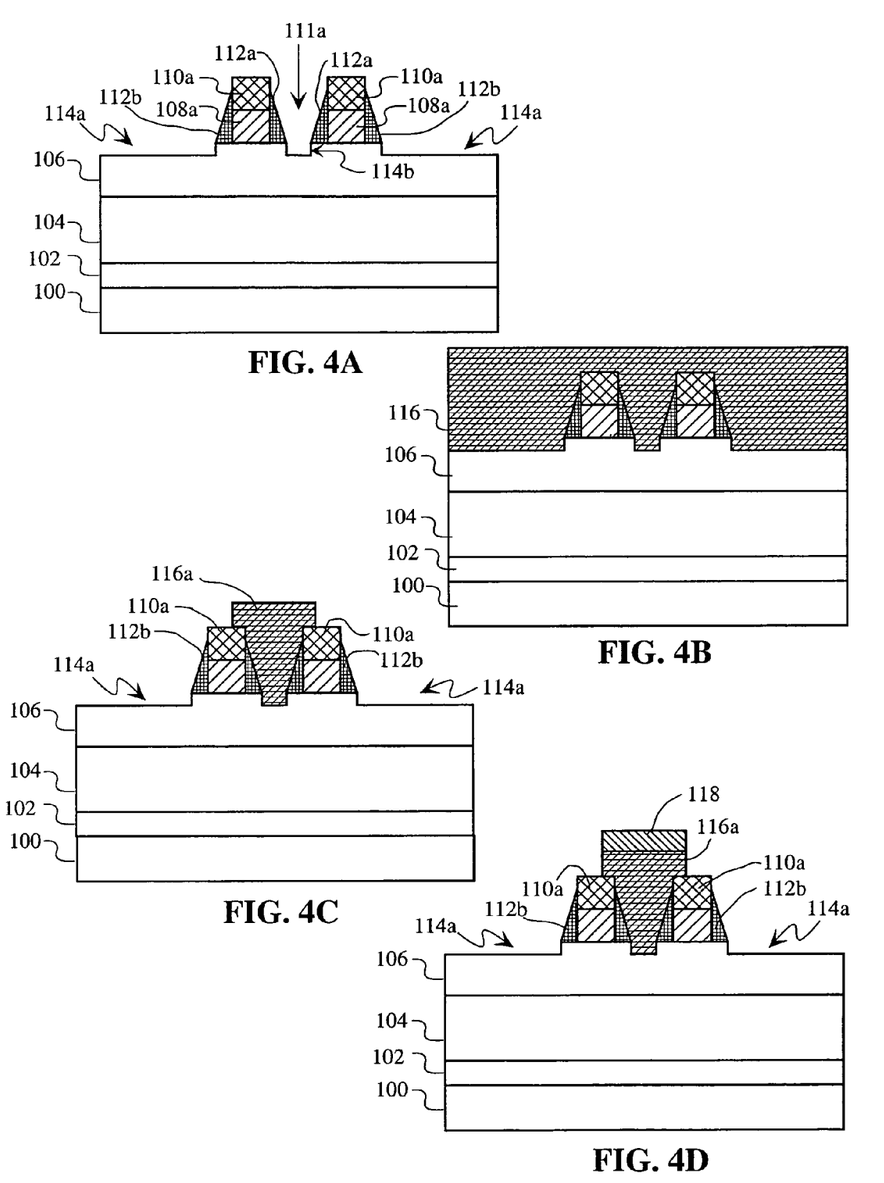
FIG. 4A illustrates the formation of a recessed region in the base of the semiconductor structure shown in FIG. 3D.
FIG. 4B illustrates the formation of emitter material in the recessed region and over the base contacts of the semiconductor structure shown in FIG. 4A.
FIG. 4C illustrates the formation of an emitter in the emitter material of the semiconductor structure shown in FIG. 4B.
FIG. 4D illustrates a completed semiconductor structure according to an embodiment of the present invention.

After the creation of the sidewalls 112a, 112b, an emitter can be deposited directly on the base 106, or recessed regions can be formed in the intrinsic portions of base 106. FIG. 4A shows the formation of recessed regions 114a, 114b in the intrinsic portions of the base 106. The recessed regions 114a, 114b can be created by etching away a portion of the third sublayer 106c such that the second sublayer 106b is exposed. The etchant used for this etch would be selected such that it does not react with the second sublayer 106b. In this way, the second sublayer 106b acts as an etch stop. Alternatively, a portion of the second sublayer 106b may also be etched away so that the emitter is deposited on the first sublayer 106a. If the second sublayer 106b is removed, then an appropriate etchant that does not react with the first sublayer 106a is used. By thinning a portion of the base layer 106 in the intrinsic regions to create recessed regions 114a, 114b, the value for ft of the HBT is improved. An etchant that may be used in the formation of recessed regions 114a, 114b may comprise a mixture of citric acid, phosphoric acid, hydrogen peroxide and water.

FIG. 4B shows the deposition of emitter material 116 over the base layer 106, between the dielectric sidewalls 112a, 112b, and the dielectric caps 110a, following the formation of the recessed regions 114a, 114b. Preferably, the emitter material 116 is epitaxially grown. Using known photolithographic techniques, the emitter material 116 is exposed and developed, thereby leaving an emitter layer 116a extending into the modified recessed region 111a and partially extending over the dielectric caps 10a, as shown in FIG. 4C. A combination of $CH_4$ or $Cl_2$-based dry etching and citric-based wet etching may be used to remove the emitter material 116 to form the emitter layer 116a. In forming the emitter layer 116a in this fashion, the dielectric cap 110a and inner dielectric sidewall 112a electrically isolate the emitter layer 116a from the base contact 108a. Finally, an emitter contact 118 is deposited over the emitter layer 116a as shown in FIG. 4D. The emitter contact 118 may be deposited using semiconductor fabrication techniques well-known in the art.

Figure 5A:
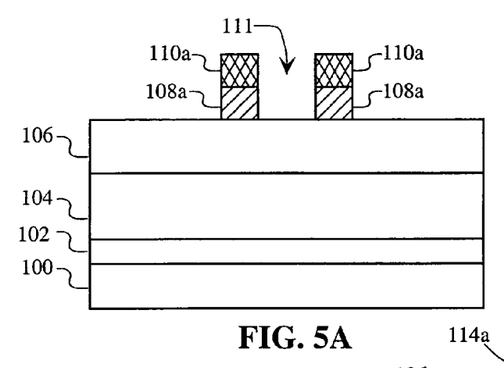
FIGS. 5A–5F illustrate the formation of a semiconductor structure according to an alternative embodiment of the present invention.

The formation of a semiconductor structure according to another embodiment of the present invention is depicted in FIGS. 5A–5F. FIG. 5A shows a semiconductor structure having the substrate layer 100, the subcollector layer 102, the collector layer 104, the base layer 106, the base contact 108a, and the dielectric cap 110a similar to that shown in FIG. 3B described above. The structure shown in FIG. 5A may comprise the materials described above and may be formed in the same manner as the structure depicted in FIG. 3B. However, rather than etching the base layer 106 after the deposition of the second dielectric layer 112, as shown in FIG. 4A, the embodiment depicted in FIGS. 5B–5F is formed by first etching the base layer 106 and then depositing the second dielectric layer 112, as described below.

Figure 5B:
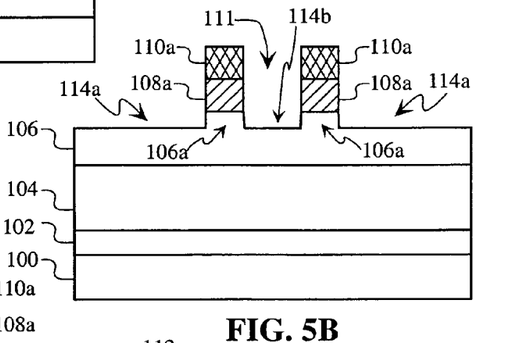

FIG. 5B shows the formation of recessed regions 114a, 114b in the intrinsic portion of the base layer 106 to provide raised portions 106a of the base layer 106. Again, the recessed regions 114a, 114b may be formed by etching away a portion of the base layer 106 to an etch stop layer. Etching the base 106 may be performed by techniques well-known in the art.

Figure 5C:
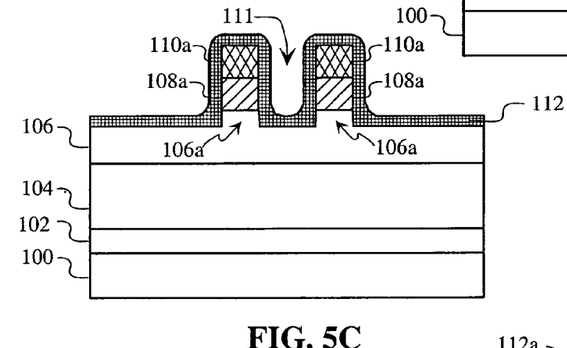
Figure 5D:
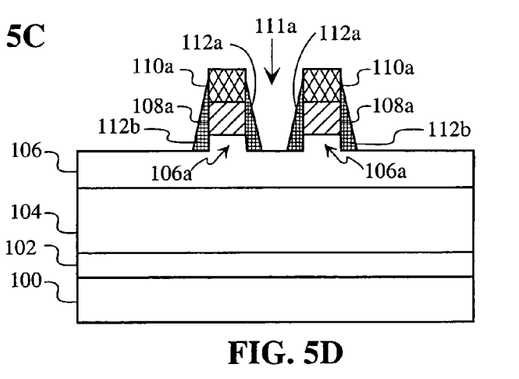

FIG. 5C depicts the deposition of the second dielectric layer 112, preferably comprising SiN, over the etched regions of the base layer 106 and the dielectric cap 110a. The second dielectric layer 102 is etched away, preferably by an anisotropic dry etch, to leave the inner dielectric sidewall 112a and the outer dielectric sidewall 112b, as shown in FIG. 5D. A portion 11a of the base layer 106 between the inner dielectric sidewalls 112a is still left exposed, which is the portion of the base layer 106 on which the emitter will be formed.

Figure 5E:
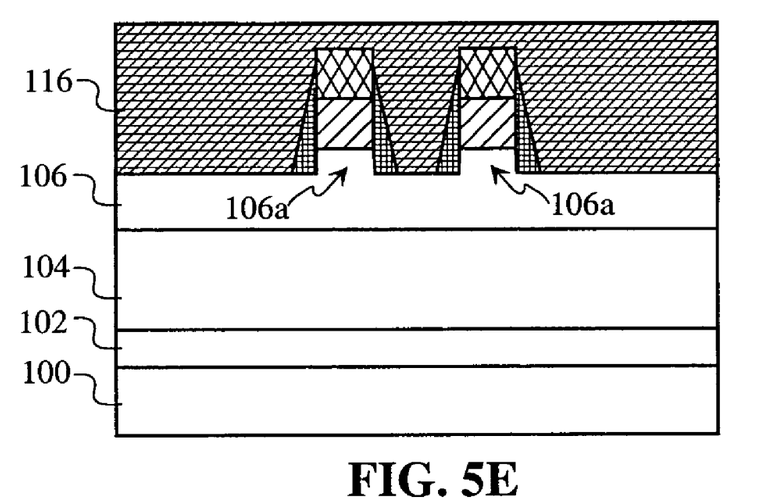
Figure 5F:
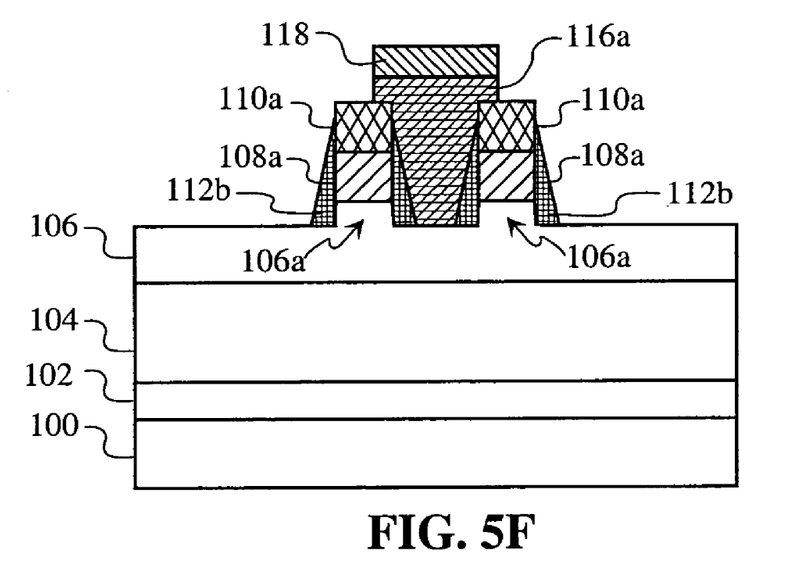

FIGS. 5E and 5F depict the formation of the emitter layer 116a and the emitter contact 118 in a similar manner to that depicted in FIGS. 4C and 4D. However, unlike the resulting structure depicted in FIG. 4D, the resulting structure shown in FIG. 5F has the dielectric sidewalls 112a, 112b disposed adjacent to the base contacts 108a and the raised portions 106a of the base layer 106. This configuration may provide for a narrower emitter layer 116a than that obtained from the structure in FIG. 4D.

From the foregoing description, it will be apparent that the present invention has a number of advantages, some of which have been described herein, and others of which are inherent in the embodiments of the invention described or claimed herein. Also, it will be understood that modifications can be made to the apparatus and method described herein without departing from the teachings of subject matter described herein. As such, the invention is not to be limited to the described embodiments except as required by the appended claims.

What is claimed is:

1. A semiconductor structure comprising:
   a first semiconductor layer;
   a first semiconductor contact disposed on the first semiconductor layer;
   a dielectric cap on the first semiconductor contact, the first semiconductor contact and the dielectric cap defining an inner portion;
   a second semiconductor layer disposed on the first semiconductor layer in the inner portion; and
   a dielectric sidewall disposed in the inner portion between the second semiconductor layer and the first semiconductor contact, wherein the dielectric sidewall electrically isolates the second semiconductor layer from the first semiconductor contact.

2. The semiconductor structure according to claim 1, wherein the first semiconductor layer has one or more raised areas and one or more recessed areas and the first semiconductor contact is disposed on at least one raised area of the one or more raised areas.

3. The semiconductor structure according to claim 2, wherein the dielectric sidewall is disposed on top of a portion of the at least one raised area and is not disposed in any portion of the one or more recessed areas.

4. The semiconductor structure according to claim 2, wherein the dielectric sidewall is disposed on a portion of the at least one raised area and a portion of at least one recessed area of the one or more recessed areas.

5. The semiconductor structure according to claim 1, wherein the semiconductor structure comprises a transistor and the first semiconductor layer comprises a base layer and the second semiconductor layer comprises an emitter layer.

6. The semiconductor structure according to claim 5, wherein the transistor comprises a heterojunction bipolar transistor and the structure further comprises:
a substrate layer;
a subcollector layer epitaxially grown on the substrate layer;
a collector layer epitaxially grown on the subcollector layer; and
the base layer is disposed on the collector layer.

7. The semiconductor structure according to claim 1, wherein the first semiconductor layer and the second semiconductor layer comprise III–V based semiconductor materials.

8. The semiconductor structure according to claim 1, wherein the first semiconductor contact comprises a refractory metal.

9. The semiconductor structure according to claim 1, wherein the dielectric sidewall comprises SiN.

10. The semiconductor structure according to claim 1, wherein the first semiconductor contact comprises a closed loop with the second semiconductor layer disposed at least partially within the closed loop.

11. A heterojunction bipolar transistor comprising:
a substrate layer;
a subcollector layer on the substrate layer;
a collector layer on the subcollector layer;
a base layer on the collector;
one or more base contacts disposed on the base layer;
one or more dielectric caps disposed on the one or more base contacts;
an emitter layer disposed on the base layer adjacent the one or more base contacts;
at least one emitter contact disposed on said emitter layer; and
one or more dielectric sidewalls disposed between the emitter layer and the one or more base contacts, wherein the one or more dielectric sidewalls electrically isolate the emitter layer from the one or more base contacts.

12. The heterojunction bipolar transistor according to claim 11, wherein the base layer has one or more raised areas and one or more recessed areas and the one or more base contacts are disposed on at least one raised area of the one or more raised areas.

13. The heterojunction bipolar transistor according to claim 12, wherein the one or more dielectric sidewalls are disposed on top of a portion of the at least one raised area and are not disposed in any portion of the one or more recessed areas.

14. The heterojunction bipolar transistor according to claim 12, wherein the dielectric sidewalls are disposed on a portion of the at least one raised area and a portion of at least one recessed area of the one or more recessed areas.

15. The heterojunction bipolar transistor according to claim 11, wherein at least one layer comprises III–V based semiconductor material and at least one layer is provided by epitaxial growth.

16. A method of fabricating a semiconductor structure comprising:
disposing a first semiconductor layer;
disposing one or more first semiconductor contacts on the first semiconductor layer;
disposing one or more dielectric caps on the one or more first semiconductor contacts;
forming one or more recessed areas in the first semiconductor layer to provide one or more raised areas of the first semiconductor layer;
depositing a dielectric layer on the first semiconductor layer and on the one or more dielectric caps;
etching a portion of the dielectric layer to expose a portion of the first semiconductor layer adjacent the one or more first semiconductor contacts and leaving a portion of the dielectric layer covering the one or more first semiconductor contacts in a region between the one or more first semiconductor contacts and the exposed portion of the first semiconductor layer; and
depositing a second semiconductor layer on the exposed portion of the first semiconductor layer and adjacent the one or more first semiconductor contacts and the one or more dielectric caps,
wherein the dielectric layer electrically isolates the one or more first semiconductor contacts from the second semiconductor layer.

17. The method according to claim 16, wherein forming one or more recessed areas in the first semiconductor layer to provide one or more raised areas of the first semiconductor layer is performed prior to depositing a dielectric layer on the first semiconductor layer and on the one or more dielectric caps.

18. The method according to claim 16, wherein forming one or more recessed areas in the first semiconductor layer to provide one or more raised areas of the first semiconductor layer is performed after depositing a dielectric layer on the first semiconductor layer and on the one or more dielectric caps and after etching a portion of the dielectric layer to expose a portion of the first semiconductor layer adjacent the one or more first semiconductor contacts and leaving a portion of the dielectric layer covering the one or more first semiconductor contacts in a region between the one or more first semiconductor contacts and the exposed portion of the first semiconductor layer.

19. The method according to claim 16, wherein the first semiconductor layer and/or the second semiconductor layer comprise III–V semiconductor materials.

20. The method according to claim 16, wherein said method is used to fabricate a heterojunction bipolar transistor.

* * * * *